United States Patent [19]

McCarthy

[11] 4,261,005
[45] Apr. 7, 1981

[54] MINIATURE HEAT SINK

[75] Inventor: Alfred F. McCarthy, Belmount, N.H.

[73] Assignee: Aavid Engineering, Inc., Laconia, N.H.

[21] Appl. No.: 16,325

[22] Filed: Feb. 27, 1979

[51] Int. Cl.³ .................... H01L 23/02; H01L 23/12
[52] U.S. Cl. ........................................ 357/81; 357/74; 174/16 HS; 165/80 B
[58] Field of Search ............... 357/81, 74; 165/105, 165/80 B; 174/16 HS

[56] References Cited

U.S. PATENT DOCUMENTS

| | | | |
|---|---|---|---|
| 3,047,648 | 7/1962 | Mowatt | 357/81 |
| 3,407,868 | 10/1968 | Coe | 357/81 |
| 3,548,927 | 12/1970 | Spurling | 357/81 |
| 3,572,428 | 3/1971 | Monaco | 357/81 |
| 3,670,215 | 6/1972 | Wilkens et al. | 357/81 |
| 3,893,161 | 7/1975 | Pesak | 357/81 |
| 4,012,769 | 3/1977 | Edwards et al. | 357/81 |
| 4,041,524 | 8/1977 | Trunk et al. | 357/81 |
| 4,054,901 | 10/1977 | Edwards et al. | 357/81 |

*Primary Examiner*—Andrew J. James
*Attorney, Agent, or Firm*—James E. Mrose

[57] ABSTRACT

A one-piece stamped sheet-metal heat sink for dissipation of heat which accumulates about the plastic housing and metallic tab of a miniature semiconductor power device is formed as a shallow open-topped channel having short upstanding sides which flare laterally outwardly and then upwardly and then both inwardly and downwardly to bent-over inner edges spaced apart just slightly closer than the sides and inclined above the sides in position to engage top edges of a plastic semiconductor package fitting within the channel. The symmetrical unitary structure thus formed exhibits flexibility enabling its inner edges to spread apart readily as a semiconductor package is pressed into the channel and to spring back into the position where its edges engage and hold the package.

5 Claims, 6 Drawing Figures

U.S. Patent  Apr. 7, 1981  4,261,005
FIG.1
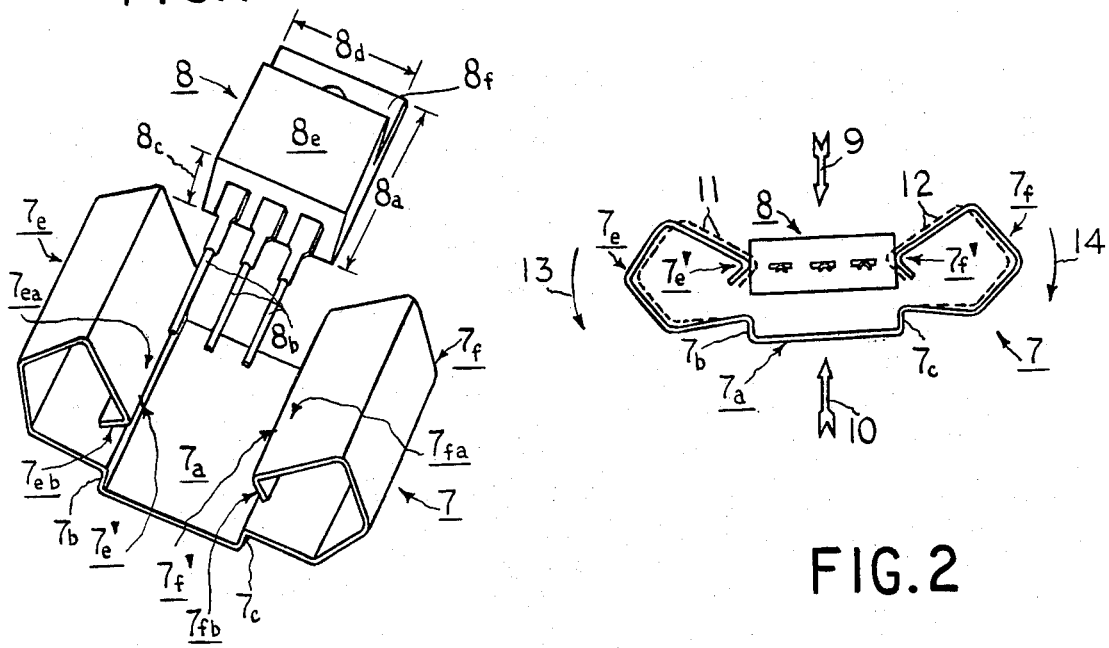
FIG.2
FIG.4
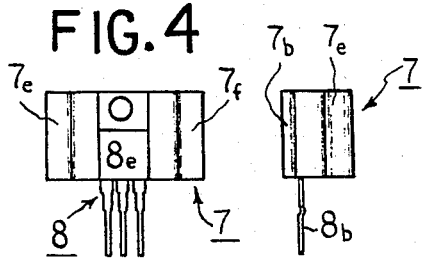
FIG.5
FIG.6
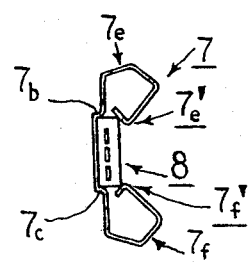
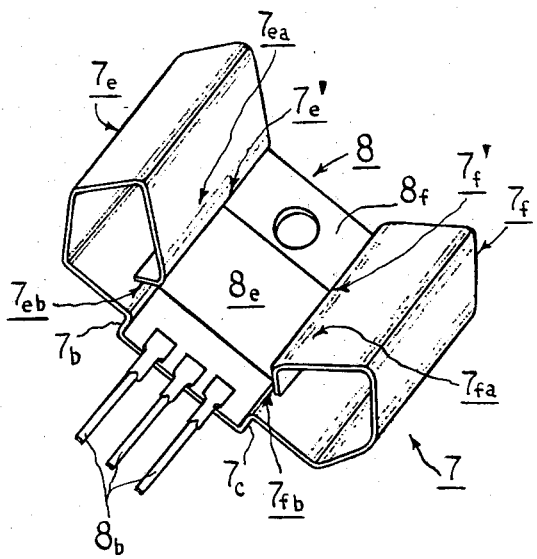
FIG.3

MINIATURE HEAT SINK

BACKGROUND OF THE INVENTION

The present invention relates to improvements in heat sinks for electronic semiconductor devices, especially so-called plastic power devices having both exposed metallic tabs and plastic-encapsulated semiconductor packages, and, in one particular aspect, to novel and improved resilient one-piece sheet-metal heat-dissipating attachments for miniature plastic power devices which are of low-cost and uncomplicated construction and lend themselves to unique snap-fitting attachments in which they make and sustain intimate broad-area contacts and at the same time exhibit relatively large radiating surfaces and free channels for air circulations.

As electronic semiconductor devices and circuit modules have evolved into ever smaller packaged sizes, problems associated with the dissipation of self-generated heat have intensified, and important power-handling capabilities must be sacrificed unless adequate cooling is realized somehow. Where the environments of use permit it, forced-liquid coolants may be employed, but, quite commonly, thermally-vulnerable regions are safeguarded with the aid of attachments in the form of finned metal extrusions or sheet-metal stampings which will conduct and radiate away heat before it can build up to intolerable levels. In that connection, encapsulated semiconductor devices or packages are sometimes provided with exposed heat-transfer parts, such as relatively thick metal tabs or plates, which promote thermal-energy transfer to such attachments and, in turn, to the ambient environment. Such heat-dissipating attachments may include a resilient spring-clip member cooperating with a heat-dissipating base (as in U.S. Pat. Nos. 3,548,927 and 4,054,901), or such attachments may take the form of a single stamped sheet-metal body shaped both to promote cooling and to hold itself in place (U.S. Pat. Nos. 3,893,161 and 4,012,769 and 4,041,524).

The ease and convenience involved in fitting the heat-sink attachments are important considerations, as are, also, the creation and maintenance of broad-area efficient and effective heat-exchange paths for conductive and convective modes of cooling. When auxiliary tools and fasteners must be used, the fastening operations can become quite awkward, and, if resort must be had to tight springing or clamping to make and hold intimate contacts, it may be difficult to force the heat sink into place and to avoid damage to the device, which may itself be rather small and delicate, and to its frail leads. Accordingly, the present teachings are aimed at reducing such difficulties by way of heat-sink attachments which may be fashioned inexpensively of sheet stock bent to a trough-like configuration from which resilient sides are looped about to form a restricted access opening allowing a miniature semiconductor package to be pressed directly into and yieldably trapped in a mated relationship within the trough.

SUMMARY OF THE INVENTION

The present invention is concerned with unique self-fastened heat sinks which offer marked advantage in respect of economy of manufacture, ease of installation and use, and promotion of efficient heat transfers, particularly in connection with the cooling of miniature power-tab type semiconductor devices. In one preferred embodiment, such a heat sink is formed as a unitary stamped-sheet-metal item having three principal portions: first, a relatively shallow trough- or channel-shaped body of substantially rectangular cross-section having an open top; second, a pair of broad-area extensions spreading oppositely outwardly from upper margins of the open-topped body and thence looping back toward the center but terminating just slightly inwardly of the body margins; and, third, bent free ends of the looped-back extensions which slope downwardly and inwardly from above and downwardly and outwardly below to allow a power-tab type device to be pressed into the channel-shaped body from above and to be snap-locked there as the resiliently-deflected ends close onto its upper edges. Depth of the shallow body portion is selected to be less than that of the thickness of the molded-plastic part of the semiconductor package (such as a TO-220 type package) which it is intended to serve, and the free ends of the looped-back extensions are disposed for engagements with upper edges of the same molded-plastic part, and the overall length of the heat sink is at least about the same as that of the entire semiconductor package, including its tab.

Accordingly, it is one of the objects of the present invention to provide a unique and advantageous heat sink which is especially useful with miniature electronic plastic power packages of the power-tab type, having a channel-shaped sheet-metal body with unitary extensions looped back to form resilient heat-dissipating fins having ends which are yieldably movable to admit a power package into the body and to close over and hold its edges in place.

A further object is to provide a miniature stamped sheet-metal heat sink, for power-tab type semiconductor devices and the like, in which a shallow open-topped body channel receives the tab and plastic package of such a device closely within it from above and snap-fastens it in place via integral looped extensions of margins of the channel which aid in convective dissipation of heat.

BRIEF DESCRIPTION OF THE DRAWINGS

Although the aspects of this invention which are considered to be novel are expressed in the appended claims, further details as to preferred particles and as to further objects and features thereof may be most readily comprehended through reference to the following detailed description when taken in connection with the accompanying drawings, wherein:

FIG. 1 is a pictorial view of a heat sink embodying the present invention, together with a power package with which it may be mated to dissipate heat;

FIG. 2 is an end view of heat sink of FIG. 1 together with a power being fitted into place, the undeflected positions of its looped sides being represented by dashed linework;

FIG. 3 provides a further pictorial view of the same heat sink and power package in a fully-mated relationship;

FIG. 4 is a top view of the mated heat sink and power-package assembly, on a somewhat reduced scale in relation to that of FIGS. 1-3;

FIG. 5 is a view of the left side of the assembly appearing in FIG. 4; and

FIG. 6 is a bottom end view of the assembly appearing in FIGS. 4 and 5.

DETAILED DESCRIPTION OF THE PREFERRED EMBODIMENTS

Having reference to the drawings, wherein like reference characters designate identical or corresponding parts throughout the different views, and more particularly to FIG. 1 thereof, one embodiment of an improved heat-sink unit, 7 is shown in closely-spaced relation to a so-called "plastic power package", 8, with which it may be cooperatively mated or fitted by depressing the package in the direction of arrow 9 (FIG. 2) and/or pressing the heat sink toward the package in the direction of arrow 10 (FIG. 2). Typically, the miniature package 8 (such as a type TO-220 electronic semiconductor package) may have an overall length, 8a, exclusive of its slender leads 8b, which is only slightly greater than one-half inch, and a thickness, 8c, which is only slightly greater than one-eighth inch, and a width, 8d, which is only slightly less than one-half inch. The plastic-encapsulated body part, 8e, is of rectangular parallelepiped form and merges with a relatively thick conductive metal tab, 8f, which serves both to mount the sensitive encapsulated semiconductor element and its connections and to conduct enough heat away from them to permit operation at significant electrical power levels. However, tab 8f may not dissipate sufficient heat under some conditions of use, and it may then become necessary to augment the cooling by way of further heat-sink material.

Unit 7 serves the latter function, and does so by fitting closely with the package 8 fully along its flat back, where the metal tab 8f is disposed, and by holding itself affixed to the package, and by exposing broad areas of metal to the ambient atmosphere, and by forming ducts through which the ambient may flow in heat-transporting currents. For those purposes, the improved heat sink 7 is fashioned to include a shallow central trough- or channel-shaped body portion, 7a, of substantially rectangular cross-section just slightly in excess of the cross-section of metal tab 8f of the cooperating power package 8. The low parallel side walls 7b and 7c which rise from the bottom flat wall 7d of that shallow central body portion extend integrally laterally outwardly in substantially opposite directions and then extend upwardly and again inwardly and downwardly, to form the two loop-shaped or substantially tubular flanges 7e and 7f. Those two lateral flanges, which are preferably symmetrical, as shown, serve as wing-like fins of broad area which will transfer to the ambient medium by radiation the heat collected from a package 8 which has been nested within and conductively contacted along its back and tab by the channel-shaped body portion 7a. However, the same two flanges also serve importantly as resilient clamping members, in that their upper inner margins, 7e' and 7f', will on the one hand yield and be spread laterally outwardly as a package is being pressed into position, as shown in FIG. 2, and will then on the other hand spring back to their original nearer parallel relationship in which they close slightly over and bear against the upper longitudinal edge of the rectangular-parallelepiped in holding relationship, as shown in FIGS. 3 and 6. Inner edges or margins 7e' and 7f' are normally disposed just slightly closer together than the width 8d' of the power package with which the heat sink cooperates, as is indicated by the dashed linework 11 and 12 representing them in that condition in FIG. 2. The outside surfaces of the flanges which form those margins 7e' and 7f' slope downwardly and inwardly, from above, and upwardly and inwardly, from below, as appears in FIGS. 1, 2, 3 and 6. The downwardly- and inwardly-sloping upper surfaces, 7ea and 7fa, are preferably sloped steeply enough, near the vertical, to result in a desired spreading action as a package is forced into place from above, although like results obtain when the user merely rolls one or both flanges downwardly and around, in the directions characterized by arrows 13 and 14 (FIG. 2), the springy sheet metal and relatively long looping of same allowing enough resilience for the rolling action. When it is desired to remove the heat sink, manipulated rolling of the flanges in the same directions will free it from a cooperating package. The upwardly- and inwardly-sloping surfaces 7eb and 7fb extending below the inner edges need only be long enough to insure that they will suitably engage the upper edges of a fitted package, preferably in a substantially line-contact fashion, and their slanting is sufficiently acute to resist unintended separation of a fitted package; also, these surfaces are obviously disposed heightwise above the lower wall of body portion 7a where their slanting spans will be sure to intersect with the upper edges of a package having a given height, 8c. Overall length of the heat sink unit is preferably about the same as the length 8a of the power package it is intended to cool.

Although the looped-around flanges or fins 7e and 7f are shown to have creases or bends at discrete spaced positions, while being substantially flat elsewhere, like shaping of the tubular "chimney" flanges may result from smooth curvatures, such that they are essentially cylindrical, for example. Detenting and perforations may serve to accommodate alignments and additional fastenings, and, for some some applications, the unit 7 may also be provided with end tabs or "feet" which will fit into co-operating circuit-board or chassis slots and aid in secure mounting of the assembly. Improved thermal "matching" may be promoted by corrugations, fingers, tabs, perforations, and the like, at appropriate locations. In another version, the slanting surfaces and associated margins 7e and 7f may be fashioned from material nearer the upper ends of walls 7b and 7c, and the free ends of the flanges may then be at laterally outer rather than laterally inner positions.

It should therefore be understood that the specific embodiments and practices shown and described herein have been presented by way of disclosure rather than limitation, and that various modifications, combinations and substitutions may be effected by those skilled in the art without departure in spirit or scope from this invention in its broader aspects and as set forth in the appended claims.

What I claim as new and desire to secure by Letters Patent of the United States is:

1. A unitary heat sink of relatively thin thermally-conductive material comprising an open-topped channel-shaped body portion substantially closed at the bottom and having relatively short upstanding parallel side walls along spaced edges thereof, the tops of said side walls merging respectively with flange walls extending first outwardly in opposite lateral directions and then inwardly and upwardly to parallel spaced margins disposed slightly closer than said side walls, said spaced margins being disposed at corners of lower upwardly-slanting portions of said flange walls and upper downwardly-slanting portions of said flange walls, said upwardly-slanting portions being disposed above said short side walls in position to engage and interfere with the upper lateral edges of an electronic semiconductor package of predetermined size when the latter is fitted within said body portion from above and through the space between said spaced margins.

2. A unitary heat sink as set forth in claim 1 wherein said channel-shaped body portion is of substantially rectangular cross-section, with said short sides being spaced apart just slightly in excess of the width of the plastic-encapsulated body of an electronic semiconductor package of the type having a flat metallic tab extending therefrom and along the bottom of the body of the package, and wherein said short sides are of height substantially the same as thickness of the tab, and wherein the said upper lateral edges with which said upwardly-slanting portions are disposed to interfere are upper edges of the plastic-encapsulated body of the package.

3. A unitary heat sink as set forth in claim 1 wherein said body portion and flange walls are of sheet metal, and wherein said flange walls extend laterally outwardly from said side walls and then inwardly for distances before reaching said margins which promote resilient yieldability of said margins in lateral and vertical directions.

4. A unitary heat sink as set forth in claim 3 wherein said flange walls extend first laterally outwardly in opposite directions from tops of said short side walls and are then looped upwardly and inwardly first to said downwardly-slanting portions, said upwardly-slanting portions being extended from said margins and downwardly-slanting portions.

5. A miniature unitary resilient heat sink fashioned of sheet metal, comprising an open-topped and open-ended channel-shaped body portion of substantially rectangular cross-section proportioned to accommodate the rectangular cross-section of the plastic-encapsulated body package of an electronic semiconductor device of the type having a flat metallic tab along the back of the body package and extending outwardly therefrom, said channel-shaped body portion having a flat bottom and relatively short upstanding parallel sides along the laterally-spaced edges thereof, the height of said sides being substantially the same as thickness of the tab and the overall length of said body portion and sides being substantially the same as that of the body package with its tab, the tops of said side walls being merged with flange walls forming tubular cooling flanges alongside said body portion, said flange walls extending first laterally outwardly in opposite directions from said tops of said side walls and then looping upwardly and inwardly and then slanting downwardly to parallel spaced margins disposed slightly closer than said side walls, said margins appearing at the junctions between the downwardly-slanting wall portions and upwardly- and inwardly-slanting wall portions rising from below, said upwardly-slanting portions of said flange walls being disposed above said side walls in position to make substantially line contact with and interfere with the upper lateral edges of the body package of a device fitted within said body portion of the heat sink from above and through the space between said margins, and said flange walls being looped for distances which promote resilient spreading apart of said margins to accommodate fitting of the device from above.

* * * * *